(12) United States Patent
Won (10) Patent No.: US 12,087,584 B2
(45) Date of Patent: Sep. 10, 2024

(54) METHOD FOR FORMING SEMICONDUCTOR STRUCTURE

(71) Applicant: CHANGXIN MEMORY TECHNOLOGIES, INC., Anhui (CN)

(72) Inventor: Daejoong Won, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 497 days.

(21) Appl. No.: 17/445,649

(22) Filed: Aug. 23, 2021

(65) Prior Publication Data

US 2022/0037158 A1    Feb. 3, 2022

Related U.S. Application Data

(63) Continuation of application No. PCT/CN2021/103834, filed on Jun. 30, 2021.

(30) Foreign Application Priority Data

Jul. 28, 2020  (CN) .......................... 202010737116.9

(51) Int. Cl.
  *H01L 21/265*   (2006.01)
  *H01L 21/225*   (2006.01)

(52) U.S. Cl.
  CPC .... *H01L 21/26506* (2013.01); *H01L 21/2251* (2013.01)

(58) Field of Classification Search
  None
  See application file for complete search history.

(56) References Cited

U.S. PATENT DOCUMENTS

| 6,137,145 A | 10/2000 | Cheek |
| 6,649,513 B1 * | 11/2003 | Tsai ..................... H01L 21/3212 |
| | | 257/E21.309 |
| 7,767,562 B2 | 8/2010 | Tews |
| 10,217,836 B2 | 2/2019 | Park et al. |
| 2008/0128782 A1 * | 6/2008 | Chen ................... H01L 29/7883 |
| | | 257/316 |

(Continued)

FOREIGN PATENT DOCUMENTS

| CN | 101882603 A | 11/2010 |
| CN | 102034710 A | 4/2011 |
| CN | 102760656 A | 10/2012 |

(Continued)

OTHER PUBLICATIONS

K. Park et al 1991 J. Electrochem. Soc. 138 545, hereinafter Park (Year: 1991).*

*Primary Examiner* — Evren Seven
*Assistant Examiner* — Cole Leon Lindsey
(74) *Attorney, Agent, or Firm* — Syncoda LLC; Feng Ma (57) ABSTRACT

A method for forming a semiconductor structure includes: providing a substrate, a gate dielectric layer and an undoped polycrystalline silicon layer sequentially stacked; performing a thermal doping process, and doping first doping ions in the polycrystalline silicon layer; and performing an ion implantation process, and doping second doping ions in a preset region of the polycrystalline silicon layer. The preset region is spaced at a preset distance from a surface of the polycrystalline silicon layer away from the gate dielectric layer in a direction perpendicular to a surface of the substrate.

16 Claims, 5 Drawing Sheets

(56) References Cited

U.S. PATENT DOCUMENTS

2010/0285642 A1* 11/2010 Rouh .............. H01L 21/823842
              438/232
2013/0240996 A1* 9/2013 Yin ................... H01L 29/66545
              257/E27.06

FOREIGN PATENT DOCUMENTS

CN          110112070 A      8/2019
KR         20020002092 A     1/2002

* cited by examiner

METHOD FOR FORMING SEMICONDUCTOR STRUCTURE

CROSS-REFERENCE TO RELATED APPLICATIONS

This is a continuation of International Patent Application No. PCT/CN2021/103834, filed on Jun. 30, 2021, which claims priority to Chinese Patent Application No. 202010737116.9 filed on Jul. 28, 2020. The disclosures of these applications are hereby incorporated by reference in their entirety.

BACKGROUND

Capacitance size of a transistor is one of performance indexes of the transistor. In the existing technology, the capacitance size of the transistor is usually increased by reducing a physical thickness of a gate dielectric layer, which may, however, cause a risk of breakdown of the gate dielectric layer due to extreme thinness. At present, the main technical means adopted is to reduce the thickness of the gate depletion layer under the condition that the thickness of the gate dielectric layer is unchanged, thereby achieving the purposes of reducing a capacitance equivalent thickness and increasing the capacitance of the transistor.

SUMMARY

Embodiments of the present disclosure relate to a method for forming a semiconductor structure.

In order to solve the foregoing problem, embodiments of the present disclosure provide a method for forming a semiconductor structure. The method may include the following operations. A substrate, a gate dielectric layer and an undoped polycrystalline silicon layer which are sequentially stacked are provided. A thermal doping process is performed, and first doping ions are doped in the polycrystalline silicon layer. An ion implantation process is performed, and second doping ions are doped in a preset region of the polycrystalline silicon layer. In a direction perpendicular to a surface of the substrate, the preset region is spaced at a preset distance from a surface of the polycrystalline silicon layer away from the gate dielectric layer.

BRIEF DESCRIPTION OF THE DRAWINGS

One or more embodiments are illustrated by way of example in the figures of the accompanying drawings, which are not to be construed as limiting the embodiments. The figures of the accompanying drawings are not to scale unless otherwise indicated.

NUMERAL REFERENCES

11, 21, 31: substrate; 12, 22, 32: gate dielectric layer; 130, 230: undoped polycrystalline silicon layer; 131, 231: initial doping region; 13, 23, 33: doped polycrystalline silicon layer; 232: preset region; d: preset distance; 24: barrier layer; 341: metal barrier film; 34: metal barrier layer.

DETAILED DESCRIPTION

Figure 1:
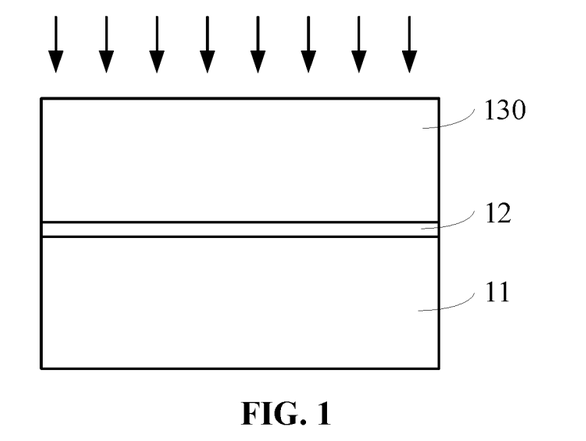
FIG. 1 is a first schematic diagram corresponding to various operations of a method for forming a semiconductor structure.
Figure 2:
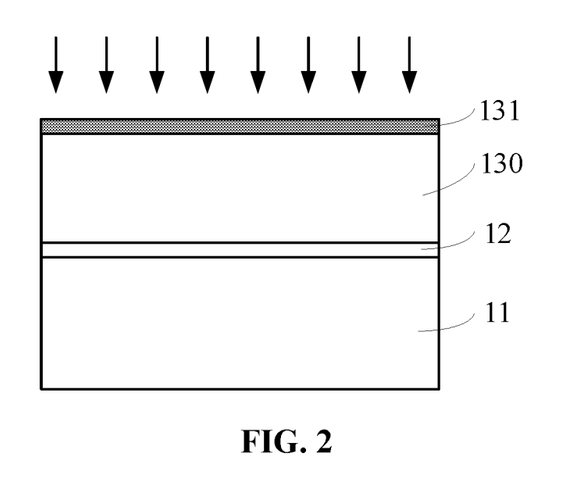
FIG. 2 is a second schematic diagram corresponding to various operations of a method for forming a semiconductor structure.
Figure 3:
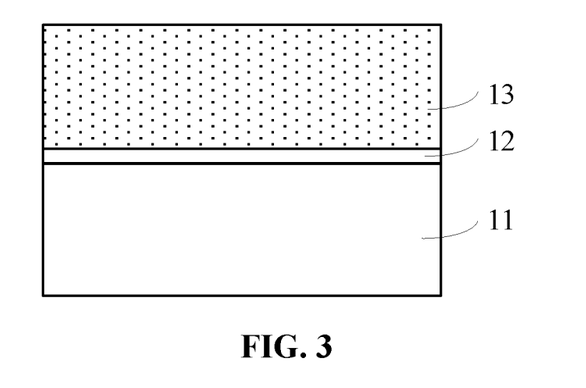
FIG. 3 is a third schematic diagram corresponding to various operations of a method for forming a semiconductor structure.

FIGS. 1 to 3 are schematic diagrams of a method for forming a semiconductor structure.

The method for forming the semiconductor structure includes the following operations. A substrate 11, a gate dielectric layer 12, and an undoped polycrystalline silicon layer 130 which are sequentially stacked are provided. A doping process is performed to dope doping ions in a surface region of the undoped polycrystalline silicon layer 130 away from the gate dielectric layer 12 and form an initial doping region 131. A thermal processing process is performed to diffuse the doping ions in the initial doping region 131 downwards to form a doped polycrystalline silicon layer 13.

It is to be noted that the thermal doping process for the doping ions may be generally divided into two types: limited source diffusion and constant surface source diffusion. The limited source diffusion means that in the diffusion process, a doping ion source is limited to a situation that a total number of doping ions doped in a thin surface layer of a polycrystalline silicon layer before diffusion is unchanged, and is diffused to other regions in the polycrystalline silicon layer by means of the limited doping ions. The constant surface source diffusion means that in the diffusion process, the polycrystalline silicon layer is always in a source-containing atmosphere, i.e., the concentration of the thin surface layer of the polycrystalline silicon layer is always unchanged, and the number of doping ions in the polycrystalline silicon layer is continuously increased along with the change of time.

The limited source diffusion refers to that a thermal processing process is performed after the doping process, and the constant surface source diffusion refers to that a thermal processing process is performed during the doping process, but either diffusion mode is limited by the solid solubility of the doping ions.

Specifically, since a concentration difference is one of the basic conditions for diffusion, the concentration of the doping ions is necessarily stepped down in a diffusion direction of the doping ions during the thermal doping process. For the limited source diffusion, the diffusion is stopped when the doping ions in the thin surface layer are redistributed with the concentration stepped down. For the constant surface source diffusion, the diffusion is stopped when the concentration of the doping ions in the thin surface layer needs to be higher than the solid solubility limit to continue for diffusion depending on the concentration difference.

That is, regardless of the limited source diffusion or the constant surface source diffusion, due to the limitation of the concentration difference, it is necessary that the concentration of doping ions in some regions cannot reach the solid solubility limit, and the concentration of doping ions at any position does not exceed the solid solubility limit. In this way, the total number of the doping ions in the polycrystalline silicon layer is limited, and the doping ions are more concentrated on a portion of the polycrystalline silicon layer away from the gate dielectric layer. When the doping ions migrate under the action of an electric field to form a depletion layer, since the concentration of the doping ions in a region close to the gate dielectric layer is low, it is more likely to form a thick depletion layer, so that a capacitance equivalent thickness is large, and the capacitance value is small.

Figure 4:
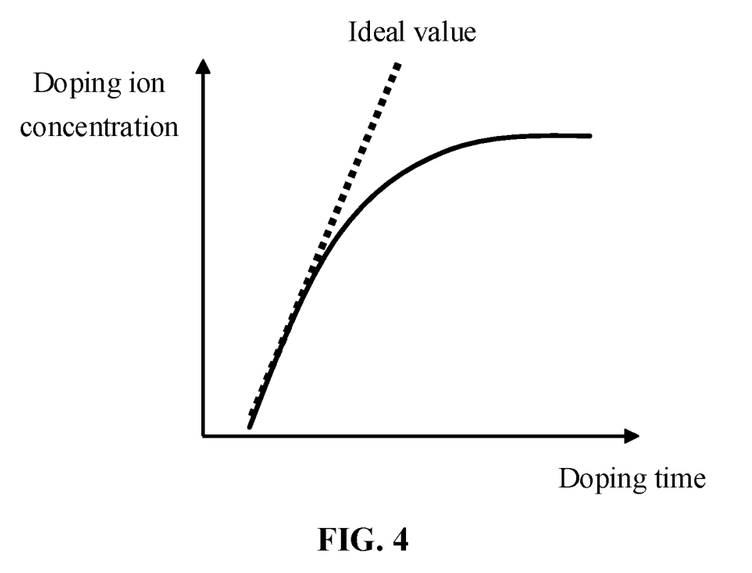
FIG. 4 is a schematic diagram of variation of a doping ion concentration at a certain position in a polycrystalline silicon layer varying with a doping time.
Figure 5:
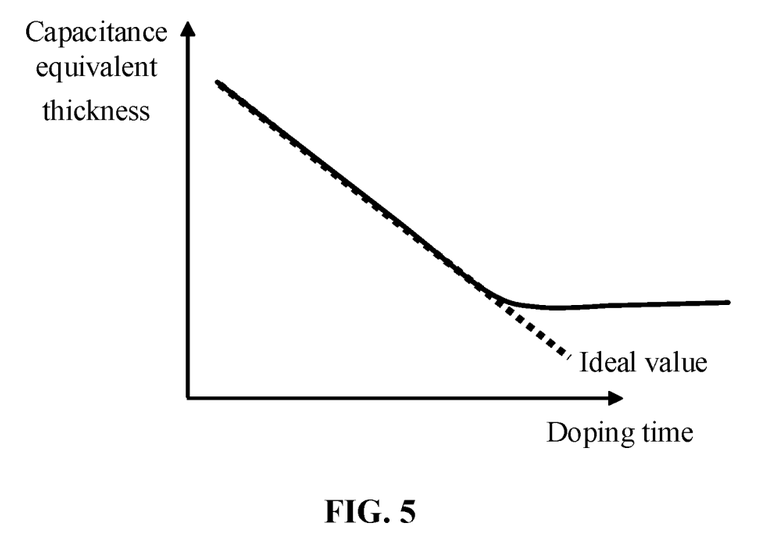
FIG. 5 is a schematic diagram of variation of a capacitance equivalent thickness of a polycrystalline silicon layer varying with a doping time.

FIG. 4 is a schematic diagram of variation of a doping ion concentration at a certain position in a polycrystalline silicon layer varying with a doping time. The horizontal axis represents the doping time, and the vertical axis represents the doping ion concentration at a certain position. As the doping process progresses, the doping ion concentration at a certain position tends to be saturated, so that the solid solubility limit cannot be broken through, thereby causing the doping process to be ineffective or the diffusion process to be stopped. Referring to FIG. 5, FIG. 5 is a schematic diagram of variation of a capacitance equivalent thickness of a polycrystalline silicon layer varying with a doping time. The horizontal axis represents the doping time, and the vertical axis represents the capacitance equivalent thickness. As the doping process progresses, since the concentration of doping ions in the polycrystalline silicon layer tends to be saturated, the capacitance equivalent thickness also tends to be saturated.

In order to solve the foregoing problems, the embodiment of the present disclosure provides a method for forming a semiconductor structure. An ion implantation process is performed after a thermal doping process, so that the concentration of doping ions in a polycrystalline silicon layer can exceed a solid solubility limit of the doping ions, which facilitates to reduce the thickness of the depletion layer and further reduce the capacitance equivalent thickness. In addition, second doping ions are doped in a region spaced apart from a top surface, which facilitates to improve the diffusion rate of the second doping ions, improve the concentration of the doping ions in the polycrystalline silicon layer close to the gate dielectric layer, and enable the thickness of the depletion layer to be small for a certain number of carriers migrations, i.e., the capacitance equivalent thickness is small, and the capacitance is large.

In order to make the objects, technical solutions and advantages of the embodiments of the present disclosure clear, the embodiments of the present disclosure will be described in detail below in combination with the accompanying drawings. It may be understood by those of ordinary skill in the art that in various embodiments of the present disclosure, numerous technical details are set forth in order to provide a better understanding of the present disclosure. However, even without these technical details and various changes and modifications based on the following embodiments, the claimed technical solution of the present disclosure may be implemented.

FIGS. 6 to 11 are schematic diagrams corresponding to various operations of a method for forming a semiconductor structure according to an embodiment of the present disclosure.

Figure 6:
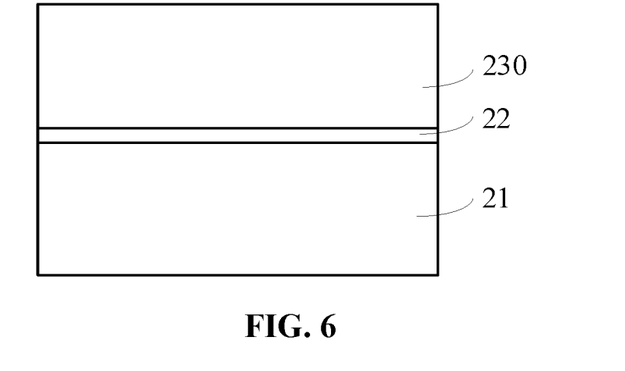
FIG. 6 is a first schematic diagram corresponding to various operations of a method for forming a semiconductor structure according to an embodiment of the present disclosure.

Referring to FIG. 6, a substrate 21, a gate dielectric layer 22, and an undoped polycrystalline silicon layer 230 sequentially stacked are provided.

The substrate 21 may be doped with doping ions to form doping regions and channel regions between the adjacent doping regions. The substrate 21, after being doped with the doping ions, may constitute a metal oxide semiconductor (MOS) transistor together with the gate dielectric layer 22 and a doped polycrystalline silicon layer. The type of the MOS transistor depends on the type of the doping ions doped in the substrate 21. The type of the MOS transistor includes an NMOS transistor and a PMOS transistor.

In the present embodiment, the gate dielectric layer 22 is a nitrogen-doped oxide layer. The nitrogen-doped oxide layer has a good ion blocking effect and is favorable for blocking doping ions in the doped polycrystalline silicon layer from permeating into the substrate 21, thereby ensuring that the substrate 21 has good performance.

The ion doping of the undoped polycrystalline silicon layer 230 may include a plurality of operations or be implemented through at least one process. The undoped polycrystalline silicon layer 230 is ion-doped through a thermal doping process in the embodiments of the present disclosure. Specifically, taking the limited source diffusion process as an example, the ion doping of the undoped polycrystalline silicon layer 230 includes the following operations.

Figure 7:
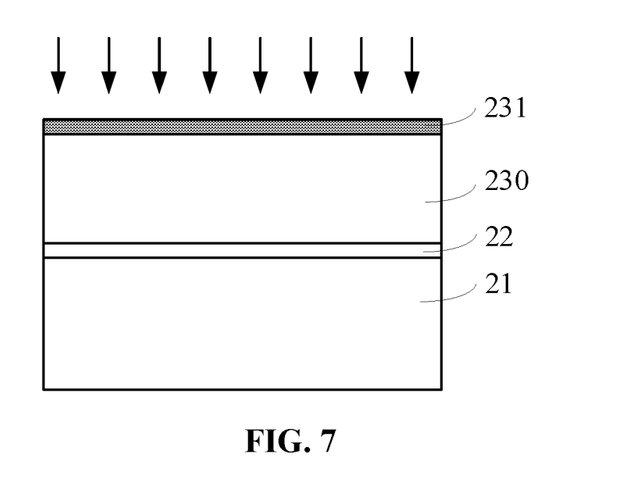
FIG. 7 is a second schematic diagram corresponding to various operations of a method for forming a semiconductor structure according to an embodiment of the present disclosure.

Referring to FIG. 7, a doping process is performed to dope first doping ions in a surface region of the undoped polycrystalline silicon layer 230 away from the gate dielectric layer 22 to form an initial doping region 231.

In the present embodiment, the first doping ions may be doped using a plasma ion implantation process. The first doping ions include N-type ions or P-type ions. The disclosure takes the first doping ions being P-type ions as an example. The plasma ion implantation process has low requirements on a target temperature, has a high doping rate, and is favorable for avoiding damage to the polycrystalline silicon layer caused due to a thermal shock formed by heating. In addition, when the plasma ion implantation process performs ion implantation, ions are not subjected to field screening, the implantation of ions per unit time is large, the productivity is high, and the initial doping region 231 can have a high concentration of first doping ions.

In the present embodiment, the concentration of the first doping ions in the initial doping region 231 is greater than the solid solubility limit of the first doping ions in the polycrystalline silicon layer. In this way, it is beneficial to increase the total number of the doping ions in the limited source diffusion, and further improve the concentration of the first doping ions in the doped polycrystalline silicon layer.

Figure 8:
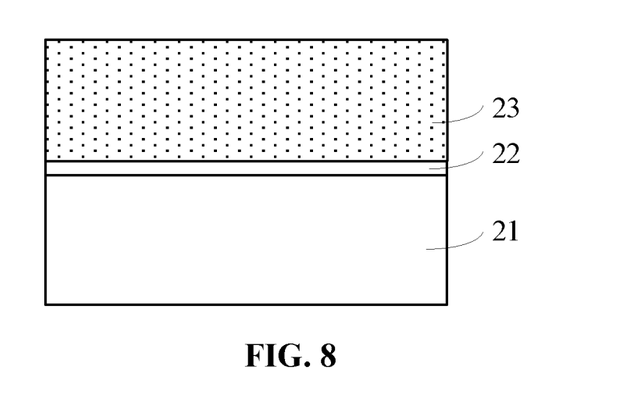
FIG. 8 is a third schematic diagram corresponding to various operations of a method for forming a semiconductor structure according to an embodiment of the present disclosure.

Referring to FIG. 8, a first thermal processing process is performed to diffuse the first doping ions in the initial doping region 231 downwards to form a doped polycrystalline silicon layer 23.

In the present embodiment, the first thermal processing process includes Rapid Thermal Processing (RTP), e.g., an RTP annealing process. The RTP annealing process may heat the entire polycrystalline silicon layer to a temperature range of 400–1300° C. in a very short period of time, has a short annealing time, and is beneficial to slow down a thermal shock to the doped polycrystalline silicon layer 23, thereby ensuring that the doped polycrystalline silicon layer 23 has good structural performance. In addition, compared with the furnace tube annealing, the RTP annealing process has the advantages of small thermal budget, small impurity movement in silicon, small pollution, short processing time and the like.

It is to be noted that since the concentration difference is the basic condition for diffusion, the concentration of the first doping ions is actually stepped down in a direction of a top surface of the doped polycrystalline silicon layer 23 toward a bottom surface of the doped polycrystalline silicon layer 23 after the first thermal processing process is completed. In addition, after the first thermal processing process is completed, an actual concentration of the first doping ions at each position in the doped polycrystalline silicon layer 23 is also related to the type of the first doping ions (different doping ion types correspond to different solid solubilities), energy of the first thermal processing process, the thickness of the undoped polycrystalline silicon layer 230 (referring to FIG. 6) in a direction perpendicular to the surface of the substrate 21, and the concentration of the first doping ions in the initial doping region 231 (referring to FIG. 7).

Specifically, the solid solubility of the first doping ions is higher, the doping concentration of the first doping ions at each position in the doped polycrystalline silicon layer 23 is higher. When the energy of the first thermal processing process is high, the first doping ions in the surface region may be diffused to a greater extent, and the concentration of the first doping ions in a region of the doped polycrystalline silicon layer 23 close to the gate dielectric layer 22 is higher. As the thickness of the doped polycrystalline silicon layer 23 in a direction perpendicular to the surface of the substrate 21 is larger, the number of concentration steps of the first doping ions in the diffusion direction is larger, the number of dilution times of the first doping ions in the diffusion direction is larger, and the concentration of the first doping ions in a portion of the doped polycrystalline silicon layer 23 close to the gate dielectric layer 22 is lower. The concentration of the first doping ions in the initial doping region 231 is higher, and the doping concentration of the first doping ions at each position in the doped polycrystalline silicon layer 23 is higher.

Figure 9:
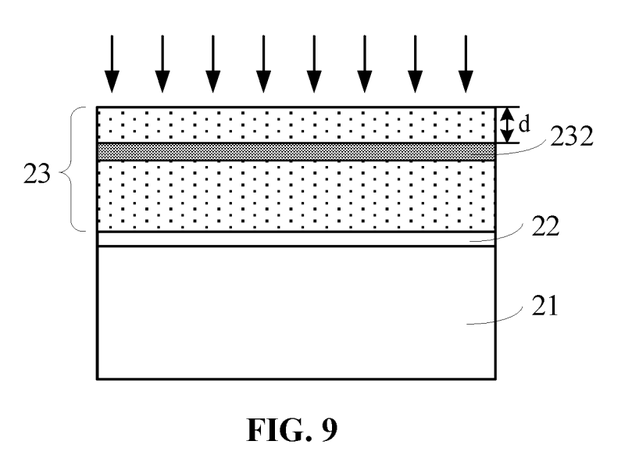
FIG. 9 is a fourth schematic diagram corresponding to various operations of a method for forming a semiconductor structure according to an embodiment of the present disclosure.

Referring to FIG. 9, an ion implantation process is performed after the thermal doping process, and second doping ions are doped in a preset region 232 of the doped polycrystalline silicon layer 23.

In the present embodiment, the second doping ions are the same as the first doping ions and include boron ions or boron-like ions. The boron-like ions include at least one of BF2+ or BF3+.

In the present embodiment, there is a preset distance d between the preset region 232 and a surface of the doped polycrystalline silicon layer 23 away from the gate dielectric layer 22 in a direction perpendicular to a surface of the substrate 21. The ion implantation process is performed after the thermal doping process, so that the concentration of doping ions at any position in the doped polycrystalline silicon layer 23 exceeds the solid solubility limit of the doping ions. When a fixed number of carriers (i.e. second doping ions) migrate in a direction far away from the gate dielectric layer 22 under the action of an electric field, the concentration of the second doping ions in a region close to the gate dielectric layer 22 is higher, the thickness of the depletion layer is smaller, and the capacitance equivalent thickness is smaller.

In addition, since the concentration of the first doping ions is stepped down in a direction of the doped polycrystalline silicon layer 23 toward the gate dielectric layer 22, the second doping ions are doped in the preset region 232 spaced from the top surface, which is beneficial to improve the difference between the concentration of the doping ions in the preset region 232 and the concentration of the doping ions in regions on both sides of the preset region 232, thereby improving the diffusion rate of the second doping ions and shortening a process cycle.

It is to be noted that the diffusion rate of the second doping ions is related to the type of the thermal doping process. Compared with the limited source diffusion process, after the constant surface source diffusion process is performed, the concentration of doping ions at any position in the doped polycrystalline silicon layer 23 is higher, and correspondingly, if the ion implantation process injects the same dose in the preset region 232, the concentration difference between the preset region and an adjacent region is small, and the diffusion speed is low.

Further, the second doping ions are doped in the preset region 232 spaced apart from the top surface, so that the distance between the preset region 232 and a surface of the doped polycrystalline silicon layer 23 close to the gate dielectric layer 22 may be shortened, the second doping ions may be diffused to a region of the doped polycrystalline silicon layer 23 close to the gate dielectric layer 22 more easily, thereby improving the concentration of doping ions in a portion of the doped polycrystalline silicon layer 23 close to the gate dielectric layer 22, and enabling the thickness of the depletion layer to be small for a certain number of carriers migrations, i.e., the capacitance equivalent thickness is small, and the capacitance of a semiconductor structure is large.

In the present embodiment, the preset distance d is 1 nm-10 nm, e.g., 3 nm, 5 nm, or 7 nm. Since the concentration of the first doping ions is stepped down in the direction of the doped polycrystalline silicon layer 23 toward the gate dielectric layer 22, the preset distance d is larger, the concentration difference between the doping region and a surrounding region is larger, the diffusion speed of the second doping ions is higher, and the concentration of the doping ions on a side of the doped polycrystalline silicon layer 23 close to the gate dielectric layer 22 is higher. Meanwhile, in order to avoid a large damage to the doped polycrystalline silicon layer 23 caused by a long range of the ion implantation process, a maximum value of the preset distance d needs to be limited, thereby ensuring that the doped polycrystalline silicon layer 23 has good performance. In the present embodiment, referring to FIG. 10, the second doping ions may be diffused by means of the first thermal processing process in the thermal doping process.

Figure 10:
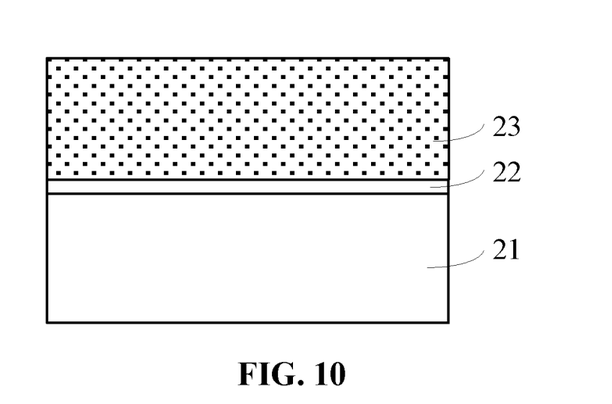
FIG. 10 is a fifth schematic diagram corresponding to various operations of a method for forming a semiconductor structure according to an embodiment of the present disclosure.

Specifically, since heat absorbed by the doped polycrystalline silicon layer 23 in the first thermal processing process may need to be conducted and released for a certain time, the second doping ions may be diffused by means of residual heat of the first thermal processing process. In other embodiments, the second doping ions are diffused by means of the second thermal processing process performed after the ion implantation process.

Figure 11:
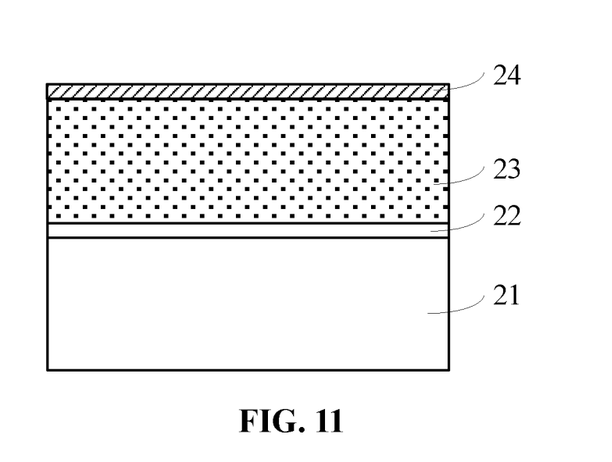
FIG. 11 is a sixth schematic diagram corresponding to various operations of a method for forming a semiconductor structure according to an embodiment of the present disclosure.

Referring to FIG. 11, after the ion implantation process is performed, a barrier layer 24 is formed on the surface of the doped polycrystalline silicon layer 23 away from the gate dielectric layer 22. The barrier layer 24 is used for blocking ion migration.

Specifically, the barrier layer is used for blocking further migration of the first doping ions and the second doping ions, so as to ensure further control on the capacitance equivalent thickness range, and ensure that the semiconductor structure has a reasonable capacitance equivalent thickness.

In the present embodiment, the ion implantation process is performed after the thermal doping process, so that the concentration of doping ions in the polycrystalline silicon layer can exceed a solid solubility limit of the doping ions, which facilitates to reduce the thickness of the depletion layer and further reduce the capacitance equivalent thickness. In addition, second doping ions are doped in a region spaced apart from a top surface, which facilitates to improve the diffusion rate of the second doping ions, improve the concentration of the doping ions in the polycrystalline silicon layer close to the gate dielectric layer, and enable the thickness of the depletion layer to be small for a certain number of carriers migrations, i.e., the capacitance equivalent thickness is small, and the capacitance is large.

Figure 12:
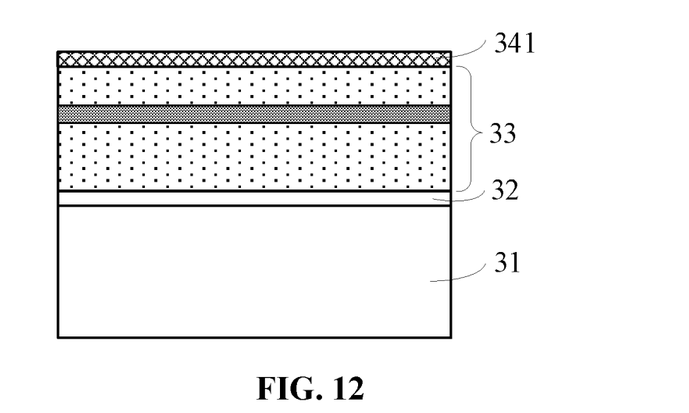
FIG. 12 is a first schematic diagram corresponding to various operations of a method for forming a semiconductor structure according to another embodiment of the present disclosure.
Figure 13:
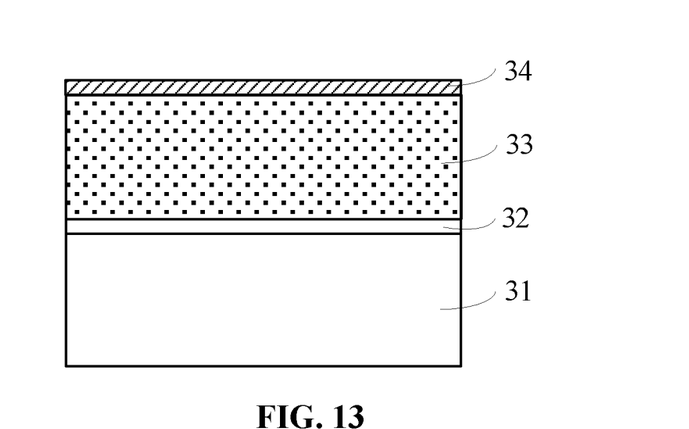
FIG. 13 is a second schematic diagram corresponding to various operations of a method for forming a semiconductor structure according to another embodiment of the present disclosure.

Another embodiment of the present disclosure also provides a method for forming a semiconductor structure. Different from the previous embodiment, in the present embodiment, the second doping ions are different from the first doping ions, and the second doping ions are diffused through a second thermal processing process performed later. Reference will now be made in detail to FIGS. 12 and 13. FIGS. 12 and 13 are schematic diagrams corresponding to various operations of a method for forming a semiconductor structure according to another embodiment of the present disclosure. The same or corresponding parts as in the previous embodiment may be referred to the corresponding descriptions of the previous embodiment, which will be not be elaborated hereinafter.

In the present embodiment, the second doping ions are different from the first doping ions and have a weight smaller than that of the first doping ions. Specifically, the first doping ions may be heavy ions and the second doping ions may be light ions. Compared to heavy ion implantation, damage density generated by light ion implantation to the doped polycrystalline silicon layer 33 is lower, and low-density damages may be better repaired by a second thermal processing process performed before or later, thereby ensuring that the doped polycrystalline silicon layer 33 has good performance.

In the present embodiment, a second thermal processing process is performed after the ion implantation process, and the second doping ions are diffused through the second thermal processing process performed after the ion implantation process. The second thermal processing process performed after the ion implantation process may be either dedicated to diffusing the second doping ions or may be used to process or form other components or films.

Compared to diffusion using the first thermal processing process performed before ion implantation, diffusion using the second thermal processing process performed later has the following advantages. On one hand, it is unnecessary to control a time interval between the thermal doping process and the ion implantation process, so that after the thermal doping process is performed, the operations of cleaning, checking, etc. are performed in more time, and the process flexibility is improved. On the other hand, the second thermal processing process may be performed for one or more times later, which facilitates to ensure that the second doping ions are fully diffused, so that a region of the doped polycrystalline silicon layer 33 close to the gate dielectric layer 32 has a higher concentration of doping ions, the capacitance equivalent thickness is small, and the capacitance of the MOS transistor is large.

Specifically, referring to FIG. 12, after the ion implantation process is performed, a metal barrier film 341 is formed on a surface of the doped polycrystalline silicon layer 33 away from the gate dielectric layer 32. Referring to FIG. 13, the second thermal processing process is performed on the metal barrier film 341 to form a metal barrier layer 34. The second doping ions are diffused through the second thermal processing process performed on the metal barrier film 341.

In the present embodiment, the weight of the second doping ions is smaller than that of the first doping ions, so that the damage caused by the ion implantation process can be effectively repaired by the second thermal processing process. In addition, the second doping ions are diffused by using the subsequent second thermal processing process, so that the second doping ions can be effectively diffused, a region of the polycrystalline silicon layer close to the gate dielectric layer has a high concentration of doping ions, the capacitance equivalent thickness is small, and the capacitance of the MOS transistor is large.

It will be appreciated by those of ordinary skill in the art that the various implementations described above are specific embodiments for implementing the present disclosure and that various changes in form and details may be made in practice without departing from the spirit and scope of the present disclosure. Any variations and modifications may be made by those skilled in the art without departing from the spirit and scope of the present disclosure. Therefore, the scope of protection of the present disclosure shall be subject to the scope of the claims.

What is claimed is:

1. A method for forming a semiconductor structure, comprising:
   providing a substrate, a gate dielectric layer and an undoped polycrystalline silicon layer sequentially stacked;
   performing a thermal doping process comprising:
   performing a doping process to implant first doping ions into a surface layer region in the polycrystalline silicon layer, wherein the surface layer region is a region of a surface of the polysilicon layer distal from the gate dielectric layer, and
   performing a first thermal processing process to diffuse the first doping ions in the polysilicon layer; and
   performing an ion implantation process, and doping to implant second doping ions in a preset region of the polycrystalline silicon layer, wherein the preset region is a region with a preset distance from the surface of the polycrystalline silicon layer distal from the gate dielectric layer, and a depth of the preset region in the polysilicon layer is greater than a depth of the surface region in the polysilicon layer.

2. The method for forming the semiconductor structure of claim 1, wherein
the preset distance is 1 nm-10 nm.

3. The method for forming the semiconductor structure of claim 1, wherein
the second doping ions are different from the first doping ions and have a weight smaller than that of the first doping ions.

4. The method for forming the semiconductor structure of claim 3, wherein
the second doping ions comprise at least one of boron ions, boron fluoride ions, or boron difluoride ions.

5. The method for forming the semiconductor structure of claim 1, wherein
the doping process comprises a plasma ion implantation process.

6. The method for forming the semiconductor structure of claim 5, wherein
a concentration of the first doping ions doped in the surface region through the plasma ion implantation process is greater than a solid solubility limit of the first doping ions in the polycrystalline silicon layer.

7. The method for forming the semiconductor structure of claim 1, wherein
the first thermal processing process comprises a Rapid Thermal Processing (RTP) annealing process.

8. The method for forming the semiconductor structure of claim 1, wherein
a second thermal processing process is performed after the ion implantation process, and the second doping ions are diffused through the second thermal processing process.

9. The method for forming the semiconductor structure of claim 1, wherein
after the ion implantation process is performed, a barrier layer for blocking ion migration is formed on the surface of the polycrystalline silicon layer away distal from the gate dielectric layer.

10. The method for forming the semiconductor structure of claim 1, further comprising:
forming a metal barrier film on the surface of the polycrystalline silicon layer distal from the gate dielectric layer; and
performing a second thermal processing process on the metal barrier film to form a metal barrier layer, wherein the second doping ions are diffused through the second thermal processing process.

11. The method for forming the semiconductor structure of claim 1, wherein
the gate dielectric layer is a nitrogen-doped oxide layer.

12. The method for forming the semiconductor structure of claim 1, wherein
a concentration of the first doping ions is stepped down in a direction of a top surface of the polycrystalline silicon layer toward a bottom surface of the polycrystalline silicon layer after the first thermal processing process is completed.

13. The method for forming the semiconductor structure of claim 1, wherein
the second doping ions are the same as the first doping ions and comprise boron ions or boron-like ions.

14. The method for forming the semiconductor structure of claim 1, wherein
the second doping ions are diffused through the first thermal processing process.

15. The method for forming the semiconductor structure of claim 1, wherein
a limited source diffusion type is adopted in the thermal doping process, wherein a total number of doping ions doped in the surface layer region of the polycrystalline silicon layer before diffusion is unchanged, and is diffused to other regions in the polycrystalline silicon layer by means of the limited doping ions.

16. The method for forming the semiconductor structure of claim 1, wherein
a constant surface source diffusion is adopted in the thermal doping process, wherein a concentration of the surface layer region of the polycrystalline silicon layer is unchanged, and the number of doping ions in the polycrystalline silicon layer is continuously increased along with the change of time.

\* \* \* \* \*